(12) United States Patent  
Wang et al.

(10) Patent No.: US 11,342,385 B2  
(45) Date of Patent: May 24, 2022

(54) PIXEL ARRANGEMENT STRUCTURE, DISPLAY SUBSTRATE, DISPLAY DEVICE, AND MASK PLATE GROUP

(71) Applicant: BOE TECHNOLOGY GROUP CO., LTD., Beijing (CN)

(72) Inventors: Hongli Wang, Beijing (CN); Lujiang Huangfu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 38 days.

(21) Appl. No.: 16/622,024

(22) PCT Filed: Dec. 28, 2018

(86) PCT No.: PCT/CN2018/124906  
§ 371 (c)(1),  
(2) Date: Dec. 12, 2019

(87) PCT Pub. No.: WO2019/153951  
PCT Pub. Date: Aug. 15, 2019

(65) Prior Publication Data  
US 2021/0143230 A1 May 13, 2021

(30) Foreign Application Priority Data  
Feb. 9, 2018 (CN) .......................... 201810137015.0

(51) Int. Cl.  
*H01L 27/32* (2006.01)  
*H01L 51/56* (2006.01)  
*C23C 14/04* (2006.01)

(52) U.S. Cl.  
CPC ........ *H01L 27/3218* (2013.01); *C23C 14/042* (2013.01); *H01L 27/3216* (2013.01); *H01L 51/56* (2013.01)

(58) Field of Classification Search  
CPC .................... H01L 27/3216; H01L 27/3218  
See application file for complete search history.

(56) References Cited

U.S. PATENT DOCUMENTS 6,903,754 B2  6/2005  Brown  
9,252,193 B2  2/2016  Kim et al.  
(Continued)

FOREIGN PATENT DOCUMENTS

CN    1539132 A    10/2004  
CN    103311266 A   9/2013  
(Continued)

*Primary Examiner* — Victoria K. Hall

(57) ABSTRACT

A pixel arrangement structure, a display substrate, a display device, and a mask plate group. The pixel arrangement structure includes multiple minimum repeat units arranged in an array; each minimum repeat unit includes a first color sub-pixel, a second color sub-pixel, and a third color sub-pixel; a first connecting line between the centers of the first color sub-pixel and the second color sub-pixel extends along a first direction, and a second connecting line between the centers of the first color sub-pixel and the third color sub-pixel extends along a second direction; the orthographic projection of the first color sub-pixel on a first straight line falls into the orthographic projection of the third color sub-pixel on the first straight line, and the orthographic projection of the first color sub-pixel on a second straight line falls into the orthographic projection of the second color sub-pixel on the second straight line.

19 Claims, 6 Drawing Sheets

(56) References Cited

U.S. PATENT DOCUMENTS

| | | | |
|---|---|---|---|
| 11,145,693 B2* | 10/2021 | Xiao | ........................ C23C 14/12 |
| 2013/0234917 A1* | 9/2013 | Lee | ..................... H01L 27/3218 |
| | | | 345/82 |
| 2015/0091785 A1 | 4/2015 | Lee | |
| 2016/0240592 A1* | 8/2016 | Li | ........................ H01L 27/3216 |
| 2016/0321982 A1* | 11/2016 | Lee | ...................... G09G 3/3291 |
| 2019/0333970 A1 | 10/2019 | Lee | |
| 2019/0355794 A1* | 11/2019 | Dai | ......................... C23C 14/04 |
| 2020/0328259 A1* | 10/2020 | Joe | ....................... H01L 27/3218 |
| 2020/0357866 A1* | 11/2020 | Zhao | ................... H01L 27/3218 |
| 2021/0359030 A1* | 11/2021 | Qiu | ..................... H01L 51/0011 |

FOREIGN PATENT DOCUMENTS

| | | |
|---|---|---|
| CN | 103515540 A | 1/2014 |
| CN | 106981501 A | 7/2017 |
| CN | 208172428 U | 11/2018 |

* cited by examiner

PIXEL ARRANGEMENT STRUCTURE, DISPLAY SUBSTRATE, DISPLAY DEVICE, AND MASK PLATE GROUP

The present application is a national stage of international application PCT/CN2018/124906 filed on Dec. 28, 2018, which claims the priority of the China Patent Application No. 201810137015.0 filed on Feb. 9, 2018. The content of the above-mentioned China patent application is incorporated in its entirety as portion of the present application by reference herein.

TECHNICAL FIELD

Embodiments of the present disclosure relate to a pixel arrangement structure, a display substrate, a display device, and a mask assembly set.

BACKGROUND

With the development of display technologies, people have increasingly higher requirements on a resolution of a display device. Because the display device with high resolution is advantageous in high display quality and the like, a scope of application thereof is also getting wider and wider. Generally, the resolution of the display device may be increased by reducing a pixel dimension and a pixel pitch. However, a reduction in the pixel dimension and the pixel pitch is also accompanied with higher and higher requirements on an accuracy of a manufacturing process, resulting in an increase in a degree of difficulty of the manufacturing process and a manufacturing cost of the display device.

On the other aspect, Sup-Pixel Rendering (SPR) technology can utilize a difference in resolutions between sub-pixels of different colors for human eyes, to change the conventional mode that a single pixel is defined simply by sub-pixels of three colors of red color, green color and blue color. Instead, a performance capability of a same pixel resolution can be simulated and achieved by using relatively smaller number of sub-pixels through sharing certain sub-pixels of colors non-sensitive to spatial resolution between different pixels, so as to reduce the difficulty in the manufacturing process and decrease the manufacturing cost.

SUMMARY

At least one embodiment of the present disclosure provides a pixel arrangement structure, including a plurality of minimum repetitive units arranged along a row direction and a column direction in an array; each of the plurality of minimum repetitive units includes a first color sub-pixel, a second color sub-pixel and a third color sub-pixel; a first connecting line of a center of the first color sub-pixel and a center of the second color sub-pixel extends along a first direction; a second connecting line of the center of the first color sub-pixel and a center of the third color sub-pixel extends along a second direction; an orthographic projection of the first color sub-pixel on a first straight line extending along the first direction falls within an orthographic projection of the third color sub-pixel on the first straight line; and an orthographic projection of the first color sub-pixel on a second straight line extending along the second direction falls within an orthographic projection of the second color sub-pixel on the second straight line.

For example, in the pixel arrangement structure provided by an embodiment of the present disclosure, a portion of the second color sub-pixel that extends beyond the first color sub-pixel in the second direction is adjacent to a portion of the third color sub-pixel that extends beyond the first color sub-pixel in the first direction.

For example, in the pixel arrangement structure provided by an embodiment of the present disclosure, an included angle between the first direction and the second direction is in the range from 80° to 100°.

For example, in the pixel arrangement structure provided by an embodiment of the present disclosure, each of the plurality of minimum repetitive units is one pixel; and line segments connecting of the center of the first color sub-pixel, the center of the second color sub-pixel and the center of the third color sub-pixel constitute a triangle.

For example, in the pixel arrangement structure provided by an embodiment of the present disclosure, the triangle includes a right triangle or an isosceles right triangle.

For example, in the pixel arrangement structure provided by an embodiment of the present disclosure, a length of the second color sub-pixel in the second direction is greater than a length of the first color sub-pixel in the second direction; and a length of the third color sub-pixel in the first direction is greater than a length of the first color sub-pixel in the first direction.

For example, in the pixel arrangement structure provided by an embodiment of the present disclosure, the first direction is parallel to the row direction, and the second direction is parallel to the column direction.

For example, in the pixel arrangement structure provided by an embodiment of the present disclosure, an included angle between the first direction and the row direction is 45°, and an included angle between the second direction and the column direction is 45°.

For example, in the pixel arrangement structure provided by an embodiment of the present disclosure, the first color sub-pixel is a green color sub-pixel, the second color sub-pixel is a blue color sub-pixel, and the third color sub-pixel is a red color sub-pixel.

For example, in the pixel arrangement structure provided by an embodiment of the present disclosure, a dimension of the blue color sub-pixel is greater than a dimension of the red color sub-pixel.

For example, in the pixel arrangement structure provided by an embodiment of the present disclosure, a shape of the second color sub-pixel is at least one selected from the group consisting of an ellipse, a hexagon, and a shape formed by a hexagon with a rounded corner at each of vertices of the hexagon; and a shape of the third color sub-pixel is at least one selected from the group consisting of an ellipse, a hexagon, and a shape formed by a hexagon with a rounded corner at each of vertices of the hexagon.

For example, in the pixel arrangement structure provided by an embodiment of the present disclosure, the shape of the second color sub-pixel has a first symmetry axis and a second symmetry axis, a length of the second color sub-pixel in a direction of the first symmetry axis is greater than a length of the second color sub-pixel in a direction of the second symmetry axis, the first symmetry axis is perpendicular to the first connecting line, and the second symmetry axis is perpendicular to the first symmetry axis and is located in a same straight line with the first connecting line; the shape of the third color sub-pixel has a third symmetry axis and a fourth symmetry axis, a length of the third color sub-pixel in a direction of the third symmetry axis is greater than a length of the third color sub-pixel in a direction of the fourth symmetry axis, the third symmetry axis is perpendicular to the second connecting line, and the fourth symmetry axis is perpendicular to the third symmetry axis and is located in a same straight line with the second connecting line.

For example, in the pixel arrangement structure provided by an embodiment of the present disclosure, an edge of the second color sub-pixel close to the third color sub-pixel is substantially parallel to an edge of the third color sub-pixel close to the second color sub-pixel; an edge of the second color sub-pixel close to the first color sub-pixel is substantially parallel to an edge of the first color sub-pixel close to the second color sub-pixel; and an edge of the third color sub-pixel close to the first color sub-pixel is substantially parallel to an edge of the first color sub-pixel close to the third color sub-pixel.

For example, in the pixel arrangement structure provided by an embodiment of the present disclosure, a distance between the edge of the second color sub-pixel close to the third color sub-pixel and the edge of the third color sub-pixel close to the second color sub-pixel is a first distance; a distance between the edge of the second color sub-pixel close to the first color sub-pixel and the edge of the first color sub-pixel close to the second color sub-pixel is a second distance; a distance between the edge of the third color sub-pixel close to the first color sub-pixel and the edge of the first color sub-pixel close to the third color sub-pixel is a third distance; and the first distance, the second distance and the third distance are substantially the same.

For example, in the pixel arrangement structure provided by an embodiment of the present disclosure, a shape of the first color sub-pixel is at least one selected from the group consisting of a circle, a square, and a shape formed by a square with a rounded corner at each of vertices of the square.

For example, in the pixel arrangement structure provided by an embodiment of the present disclosure, a shape of the second color sub-pixel is the same as a shape of the third color sub-pixel; and the shape of the second color sub-pixel and the shape of the third color sub-pixel are symmetrical about a diagonal line of a shape of the first color sub-pixel located in a bisector of a right angle formed by the first connecting line and the second connecting line.

For example, in the pixel arrangement structure provided by an embodiment of the present disclosure, the shape of the first color sub-pixel is a rectangle including a first edge and a second edge adjacent to the first edge; the shape of the second color sub-pixel and the shape of the third color sub-pixel are both hexagons; and each of the second color sub-pixel and the third color sub-pixel includes three pairs of parallel opposite edges, one of the three pairs of parallel opposite edges of the second color sub-pixel is parallel to the first edge, and one of the three pairs of parallel opposite edges of the third color sub-pixel is parallel to the second edge.

At least one embodiment of the present disclosure provides a display substrate, including any pixel arrangement structure described above.

For example, the display substrate provided by an embodiment of the present disclosure further includes: a base substrate, and a plurality of pixels on the base substrate; one of the plurality of pixels includes one of the plurality of minimum repetitive units.

For example, in the display substrate provided by an embodiment of the present disclosure, the first color sub-pixel includes a first color pixel electrode and a first color light-emitting layer disposed on the first color pixel electrode; the second color sub-pixel includes a second color pixel electrode and a second color light-emitting layer disposed on the second color pixel electrode; the third color sub-pixel includes a third color pixel electrode and a third color light-emitting layer disposed on the third color pixel electrode; the first color pixel electrode is configured to drive the first color light-emitting layer to emit light; the second color pixel electrode is configured to drive the second color light-emitting layer to emit light; and the third color pixel electrode is configured to drive the third color light-emitting layer to emit light.

For example, in the display substrate provided by an embodiment of the present disclosure, the first color sub-pixel includes a first color filter, the second color sub-pixel includes a second color filter, and the third color sub-pixel includes a third color filter.

At least one embodiment of the present disclosure provides a display device, including any display substrate described above.

At least one embodiment of the present disclosure provides a mask assembly set configured to manufacture any display substrate described above, including: a first mask including a first opening, configured to form the first color sub-pixel; a second mask including a second opening, configured to form the second color sub-pixel; and a third mask including a third opening, configured to form the third color sub-pixel.

BRIEF DESCRIPTION OF THE DRAWINGS

In order to clearly explain the technical solution in the embodiments of the present disclosure, the drawings of the embodiments will be briefly introduced in the following. Apparently, the described drawings in the following are only some embodiments of the present disclosure without any limitation to the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise", "comprising", "include", "including", etc., are intended to specify that the elements or the objects stated before these terms encompass the elements or the objects and equivalents thereof listed after these terms, but do not preclude the other elements or objects. The phrases "connect", "connected" and the like are not limited to a physical or mechanical connection, but also include an electrical connection, either directly or indirectly.

During research, inventor(s) of the present application has noticed that, currently, although the SPR technology may be utilized to improve the resolution of the display device, certain products or certain special figures and images are not suitable for the application of SPR technology. For example, a detail of an electronic display watch using the SPR technology, such as a watch hand, may lose a smooth and sharp display effect for extremely thin profile of the watch hand. Therefore, there are great demands for products with veritably, high resolution from the market.

In order to manufacture a display device with high resolution, it needs to reduce the pixel dimension and the pixel pitch; however, the reduction in the pixel dimension and the pixel pitch is also accompanied with higher and higher requirements on the accuracy of the manufacturing process, resulting in the increase of the degree of difficulty in the manufacturing process and also the manufacturing cost of the display device. For example, in manufacturing an active matrix organic light-emitting diode (AMOLED) display device with high resolution, due to a restriction in process accuracy of very fine metal mask (FMM) technology, the AMOLED display device with high resolution is difficult to be manufactured and involves expensive manufacturing cost.

Figure 1:
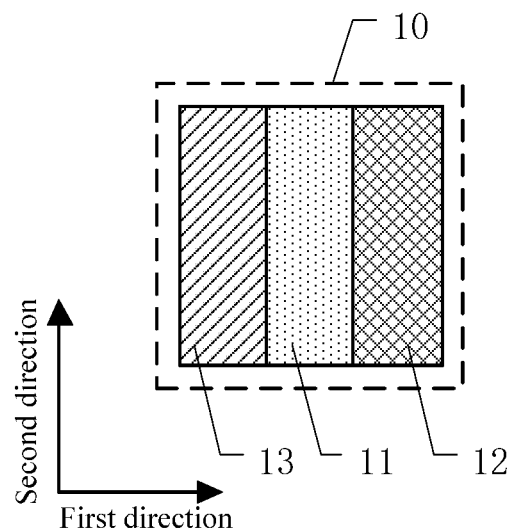
FIG. 1 is a schematic diagram of a pixel arrangement structure.

FIG. 1 is a schematic diagram of a pixel arrangement structure. As illustrated by FIG. 1, the pixel arrangement structure includes three strip-shaped sub-pixels 11, 12 and 13 which constitute one pixel unit 10. For example, the three strip-shaped sub-pixels include a red color (R) sub-pixel 13, a green color (G) sub-pixel 11 and a blue color (B) sub-pixel 12. As illustrated by FIG. 1, in a first direction, the R sub-pixel 11, the G sub-pixel 12 and the B sub-pixel 13 are arranged sequentially; that is to say, it needs to arrange three strip-shaped sub-pixels in the first direction for one pixel unit; however, as illustrated by FIG. 1, there is only one strip-shaped sub-pixel (R sub-pixel 13, G sub-pixel 11 or B sub-pixel 12) arranged in a second direction for one pixel unit. Because the pixel unit has to arrange three strip-shaped sub-pixels in the first direction, the manufacture of such pixel arrangement structure is very difficult and expensive. Moreover, under a restriction of certain process accuracy, the degree of difficulty in manufacturing the pixel unit in the first direction is different from that in the second direction; as a result, the process accuracy in the second direction is not fully utilized.

Figure 2:
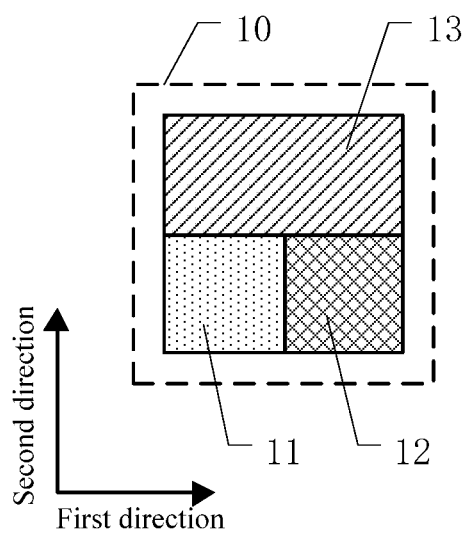
FIG. 2 is a schematic diagram of another pixel arrangement structure.

FIG. 2 is a schematic diagram of another pixel arrangement structure. As illustrated by FIG. 2, the pixel arrangement structure includes three strip-shaped sub-pixels 11, 12 and 13 which constitute one pixel unit 10. For example, the three strip-shaped sub-pixels include a red color (R) sub-pixel 13, a green color (G) sub-pixel 11 and a blue color (B) sub-pixel 12. For example, as illustrated by FIG. 2, the R sub-pixel 13 and the G sub-pixel 11 are arranged in a first direction; the B sub-pixel 12, the R sub-pixel 13 and the G sub-pixel 11 are arranged in a second direction; the B sub-pixel 12 extends along the first direction, and a length of the B sub-pixel 12 in the first direction is equal to a sum of a length of the R sub-pixel 13 in the first direction plus a length of the G sub-pixel 11 in the first direction. As a result, in the pixel arrangement structure, with uniform distributions of the R sub-pixel 13, the G sub-pixel 11 and the B sub-pixel 12 in two directions (the first direction and the second direction), it allows for only two sub-pixels arranged in the first direction and the second direction, respectively, in one pixel unit. Therefore, such pixel arrangement structure on one aspect can improve the resolution of the pixel arrangement structure, and on the other aspect achieves taking full advantages of the process accuracy in the second direction. However, in such pixel arrangement structure, the three sub-pixels are not uniformly distributed in the first direction and the second direction, and are not symmetrical; furthermore, a distance between a center of the B sub-pixel 12 and a center of the G sub-pixel 11 is not consistent with a distance between a center of the R sub-pixel 13 and the center of the G sub-pixel 11; as a result, problems such as uneven color distribution may be easily occurred. Additionally, the B sub-pixel 12 has greater dimension and smaller degree of difficulty in manufacturing; while the R sub-pixel 13 and the G sub-pixel 11 have smaller dimension and greater degree of difficulty in manufacturing.

An embodiment of the present disclosure provides a pixel arrangement structure, a display substrate and a display device. The pixel arrangement structure includes a plurality of minimum repetitive units arranged along a row direction and a column direction in an array; each of the plurality of minimum repetitive units includes a first color sub-pixel, a second color sub-pixel and a third color sub-pixel; a first connecting line of a center of the first color sub-pixel and a center of the second color sub-pixel extends along a first direction; a second connecting line of the center of the first color sub-pixel and a center of the third color sub-pixel extends along a second direction; an orthographic projection of the first color sub-pixel on a first straight line extending along the first direction falls within an orthographic projection of the third color sub-pixel on the first straight line; and an orthographic projection of the first color sub-pixel on a second straight line extending along the second direction falls within an orthographic projection of the second color sub-pixel on the second straight line. In this way, with the arrangement of the first color sub-pixel, the second color sub-pixel and the third color sub-pixel in two directions (the first direction and the second direction), the pixel arrangement structure allows for only two sub-pixels to be arranged in the first direction or the second direction in one pixel unit, so as to improve a resolution of a display device employing the pixel arrangement structure, and further to provide a display device having veritably high resolution. Additionally, the center of the second color sub-pixel and the center of the third color sub-pixel are more symmetrical about the center of the first color sub-pixel, thus a symmetry of the pixel arrangement structure is better and a display effect can be improved.

Hereinafter, the pixel arrangement structure, the display substrate and the display device provided by the embodiments of the present disclosure will be described in conjunction with the drawings.

Figure 3A:
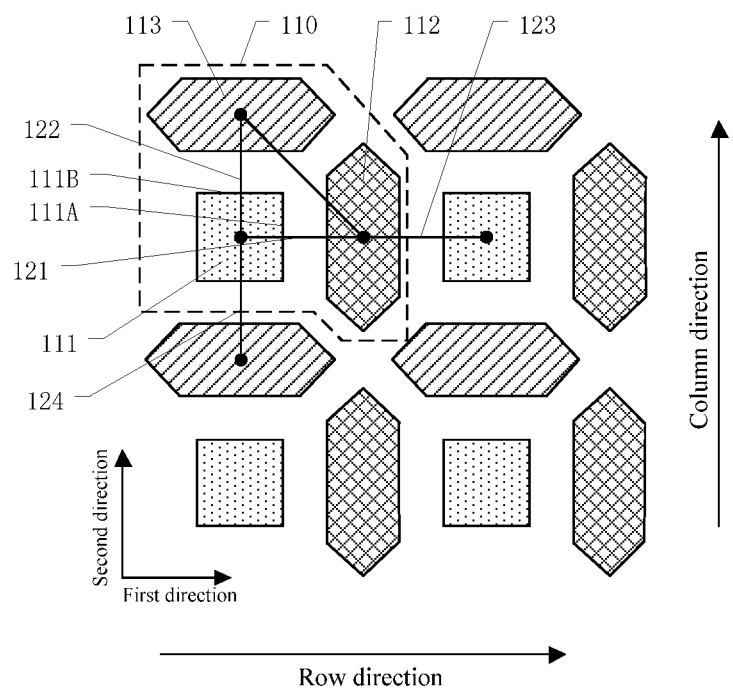
FIG. 3A is a schematic diagram of a pixel arrangement structure provided by an embodiment of the present disclosure.

An embodiment of the present disclosure provides a pixel arrangement structure. FIG. 3A is a schematic diagram of a pixel arrangement structure provided by an embodiment of the present disclosure. As illustrated by FIG. 3A, the pixel arrangement structure includes a plurality of minimum repetitive units 110 arranged along a row direction and a column direction in an array. Each of the plurality of minimum repetitive units 110 includes a first color sub-pixel 111, a second color sub-pixel 112 and a third color sub-pixel 113; a first connecting line 121 of a center of the first color sub-pixel 111 and a center of the second color sub-pixel 112 extends along a first direction; a second connecting line 122 of the center of the first color sub-pixel 111 and a center of the third color sub-pixel 113 extends along a second direction; an orthographic projection of the first color sub-pixel 111 on a first straight line extending along the first direction falls within an orthographic projection of the third color sub-pixel 113 on the first straight line; and an orthographic projection of the first color sub-pixel 111 on a second straight line extending along the second direction falls within an orthographic projection of the second color sub-pixel 112 on the second straight line. It should be explained that, the center of the first color sub-pixel, the center of the second color sub-pixel and the center of the third color sub-pixel as described above refer to geometric centers of the first color sub-pixel, the second color sub-pixel and the third color sub-pixel, respectively. Moreover, the row direction and the column direction as described above refer to the row direction and the column direction specified by matrix display. It's to be noted that, a plurality of minimum repetitive units arranged along a row direction and a column direction in an array may constitute a regular rectangle, and may also constitute other shapes, without particularly limited in the embodiments of the present disclosure.

In the pixel arrangement structure provided by the present embodiment, with the arrangement of the first color sub-pixel, the second color sub-pixel and the third color sub-pixel in two directions (the first direction and the second direction), it allows for only two sub-pixels to be arranged in the first direction or the second direction in one pixel unit, so as to improve a resolution of a display device employing the pixel arrangement structure, and further to provide a display device having veritably high resolution ratio. Additionally, because an orthographic projection of the first color sub-pixel on a first straight line extending along the first direction falls within an orthographic projection of the third color sub-pixel on the first straight line, and because an orthographic projection of the first color sub-pixel on a second straight line extending along the second direction falls within an orthographic projection of the second color sub-pixel on the second straight line, a distance between the second color sub-pixel and the third color sub-pixel is decreased, a space utilization is increased, and a resolution is improved.

For instance, in some examples, a portion of the second color sub-pixel that extends beyond the first color sub-pixel in the second direction is adjacent to a portion of the third color sub-pixel that extends beyond the first color sub-pixel in the first direction; in this way, a distance between the second color sub-pixel and the third color sub-pixel is decreased, a space utilization is increased, and a resolution is improved.

For example, an included angle between the first direction and the second direction is in the range from 80° to 100°. For another example, the included angle between the first direction and the second direction is 90°, that is, the first direction is perpendicular to the second direction.

In this way, with the arrangement of the first color sub-pixel, the second color sub-pixel and the third color sub-pixel in two directions (the first direction and the second direction), the pixel arrangement structure allows for only two sub-pixels to be arranged in the first direction or the second direction in one pixel unit, so as to improve a resolution employing the pixel arrangement structure, and further to provide a display device having veritably high resolution. Moreover, because a first connecting line of a center of the first color sub-pixel and a center of the second color sub-pixel extends along the first direction, a second connecting line of the center of the first color sub-pixel and a center of the third color sub-pixel extends along the second direction, and because an included angle between the first direction and the second direction is in the range from 80° to 100°, e.g., 90°, the center of the second color sub-pixel and the center of the third color sub-pixel are more symmetrical about the center of the first color sub-pixel. Therefore, the pixel arrangement structure has better symmetry, which can improve the display effect.

For instance, in some examples, the minimum repetitive units described above may be arranged repetitively in a translatory mode, so as to form a complete pixel arrangement structure. It should be explained that, the minimum repetitive units exclude sub-units which can be repetitively arranged in the translatory mode. Moreover, in the embodiment of the present disclosure, the minimum repetitive unit described above is one pixel; that is to say, the first color sub-pixel, the second color sub-pixel and the third color sub-pixel constitute one pixel. It's to be noted that, because the manufacturing process of the OLED product needs to utilize a FMM to form a light-emitting layer and because the process accuracy of the existing FMM is poor, the pixel arrangement structure provided by the embodiments of the present disclosure can significantly reduce the manufacturing cost of the OLED product employing the pixel arrangement structure, and improve the resolution of the OLED product employing the pixel arrangement structure.

For instance, in some examples, the first color sub-pixel is a green color sub-pixel, the second color sub-pixel is a blue color sub-pixel, and the third color sub-pixel is a red color sub-pixel. Because human eyes are more sensitive to green color, when a pixel constituted by red, green and blue sub-pixels is observed by human eyes, the green color sub-pixel would be regarded as a center of the pixel. Therefore, when a first connecting line of a center of the green color sub-pixel and a center of the red color sub-pixel extends along a first direction, a second connecting line of the center of the green color sub-pixel and a center of the blue color sub-pixel extends along a second direction, and when the first direction is perpendicular to the second direction, the center of the red color sub-pixel and the center of the blue color sub-pixel are more symmetrical about the center of the green color sub-pixel, so that a distribution of the red color sub-pixel and a distribution of the blue color sub-pixel are more uniform with respect to a distribution of the green color sub-pixel, and the display effect is improved.

For instance, in some examples, as illustrated by FIG. 3A, each of the repetitive units 110 is one pixel; line segments connecting of the center of the first color sub-pixel 111, the center of the second color sub-pixel 112 and the center of the third color sub-pixel 113 constitute a triangle.

For instance, in some examples, as illustrated by FIG. 3A, the triangle described above includes a right triangle or an isosceles right triangle.

It should be explained that, in designing the pixel arrangement structure, the sub-pixel (e.g., the first color sub-pixel, the second color sub-pixel or the third color sub-pixel) is usually designed to have a regular shape, for example, rectangle, hexagon or other shapes. In designing, the center of the sub-pixel may be a geometric center of the regular shape described above. However, in an actual manufacturing process, the shape of the sub-pixel as formed usually has a certain deviation from the above-mentioned regular shape as designed. For example, each of angles of the above-mentioned regular shape may be changed into a rounded angle; therefore, the shape of the sub-pixel (e.g., the first color sub-pixel, the second color sub-pixel or the third color sub-pixel) may be a figure with rounded angle(s). Moreover, the shape of the actually manufactured sub-pixel may also have other changes with respect to the designed shape. For example, a sub-pixel designed to have a hexagon shape may be changed to approximately have an ellipse shape during an actual manufacturing process. Therefore, the center of the sub-pixel may not strictly be a geometric center of the irregular shape of the sub-pixel as manufactured. In the embodiment of the present disclosure, the center of the sub-pixel may have a certain deviation from the geometric center of the shape of the sub-pixel. The center of the sub-pixel refers to any point in a region enclosed by certain points on radiation line segments starting from the geometric center of the sub-pixel to respective points on an edge of the sub-pixel, and these certain points on the radiation line segments are spaced from the geometric center by a distance which is ⅓ of a length of the radiation line segment. The definition for the center of the sub-pixel is applicable for the center of the shape of the sub-pixel having a regular shape, and is also applicable for the center of the shape of the sub-pixel having an irregular shape.

Moreover, as described above, due to various manufacturing errors, the shape of the sub-pixel as actually manufactured may have a deviation from the shape of the sub-pixel as designed. As a result, in the present disclosure, there may also be certain deviations for a position related to the center of the sub-pixel, and a correspondence between the center of the sub-pixel and position(s) of other object(s).

Figure 3B:
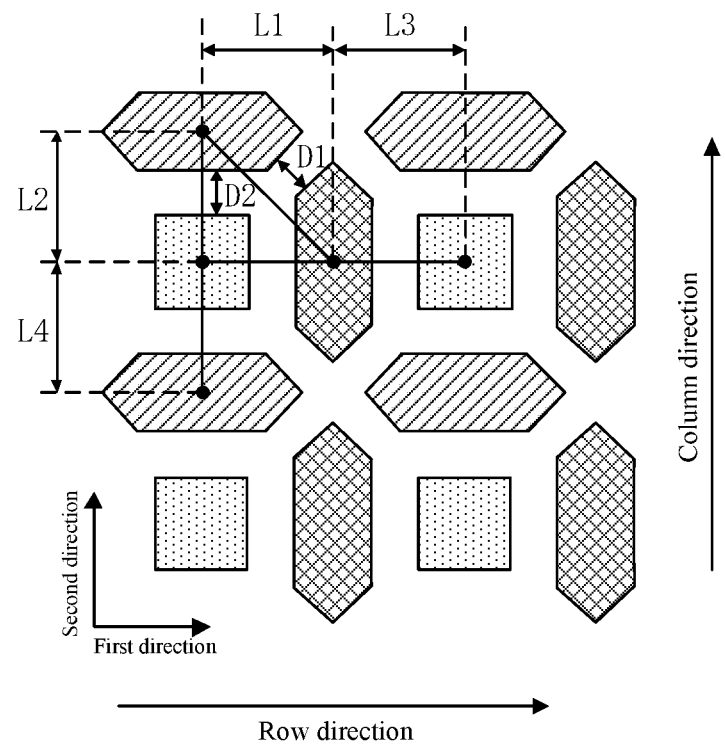
FIG. 3B is a schematic diagram of another pixel arrangement structure provided by an embodiment of the present disclosure.

For example, if a connecting line between centers of sub-pixels or a line passing through the center of the sub-pixel satisfies corresponding other definition(s) (e.g., the extending direction), this line is only required to pass through the above-described region enclosed by the certain points on the radiation line segments. For another example, the center of the sub-pixel is located in a certain line, which only requires this line to pass through a region enclosed by centers of the above-described radiation line segments. For instance, in some examples, as illustrated by FIG. 3A, a length of the second color sub-pixel 112 in the second direction is greater than a length of the first color sub-pixel 111 in the second direction; and a length of the third color sub-pixel 113 in the first direction is greater than a length of the first color sub-pixel 111 in the first direction. FIG. 3B is a schematic diagram of another pixel arrangement structure provided by an embodiment of the present disclosure. The pixel arrangement structure illustrated by FIG. 3B is the same as that of FIG. 3A. In order to clearly illustrate positional relationships between structures in the pixel arrangement structure of FIG. 3B, reference numerals for these structures in the pixel arrangement structure are omitted in FIG. 3B. As illustrated by FIG. 3B, with the arrangement in which a length of the second color sub-pixel in the second direction is greater than a length of the first color sub-pixel in the second direction and a length of the third color sub-pixel in the first direction is greater than a length of the first color sub-pixel in the first direction, it allows for a distance D1 between the second color sub-pixel and the third color sub-pixel to be close to a distance D2 between the first color sub-pixel and the second color sub-pixel, so as to take full advantages of the space within the minimum repetitive unit and also to take full advantages of the process accuracy of the device for manufacturing the pixel arrangement structure. It should be explained that, the above-described distance D1 may be a shortest distance between an edge of the second color sub-pixel and an edge of the third color sub-pixel, or a distance between an intersection point of an edge of the second color sub-pixel intersecting with a connecting line of centers of the second color sub-pixel and the third color sub-pixel and an intersection point of an edge of the third color sub-pixel intersecting with the connecting line of centers of the second color sub-pixel and the third color sub-pixel; the above-described distance D2 may be a shortest distance between the first color sub-pixel and the second color sub-pixel, or a distance between an intersection point of an edge of the first color sub-pixel intersecting with a connecting line of centers of the first color sub-pixel and the second color sub-pixel and an intersection point of an edge of the second color sub-pixel intersecting with the connecting line of centers of the first color sub-pixel and the second color sub-pixel.

For instance, in some examples, as illustrated by FIG. 3A and FIG. 3B, the first direction is parallel to the row direction, the second direction is parallel to the column direction. That is to say, a first connecting line 121 of the center of the first color sub-pixel 111 and the center of the second color sub-pixel 112 extends along the row direction, and a second connecting line 122 of the center of the first color sub-pixel 111 and the center of the third color sub-pixel 113 extends along the column direction.

For instance, in some examples, as illustrated by FIG. 3B, a length L1 of the first connecting line 121 is equal to a length L2 of the second connecting line 122. In this way, a distance between the center of the first color sub-pixel and the center of the second color sub-pixel is equal to a distance between the center of the first color sub-pixel and the center of the third color sub-pixel. Thus, it can further improve the symmetry of the second color sub-pixel and the third color sub-pixel with respect to the first color sub-pixel, thereby improving the display effect of the pixel arrangement structure. It should be explained that, when the length of the first connecting line is equal to the length of the second connecting line, the dimension or area of the second color sub-pixel may be the same with or different from that of the third color sub-pixel. For example, a width of the second color sub-pixel in the first direction and a width of the third color sub-pixel in the second direction may be adjusted according to demands, so as to provide the second color sub-pixel and the third color sub-pixel with different dimensions or areas.

For example, when the first color sub-pixel is a green color sub-pixel, the second color sub-pixel is a red color sub-pixel and the third color sub-pixel is a blue color sub-pixel, because human eyes are more sensitive to green color, the green color sub-pixel may be regarded as a center of the pixel by human eyes; as a result, when the first connecting line of the center of the green color sub-pixel and the center of the red color sub-pixel extends along the first direction, the second connecting line of the center of the green color sub-pixel and the center of the blue color sub-pixel extends along the second direction, and when the first direction is perpendicular to the second direction, by arranging the length of the first connecting line and the length of the second connecting line to be identical with each other, it can further improve the symmetry of the distribution of the red color sub-pixel and the distribution of the blue color sub-pixel with respect to the distribution of the green color sub-pixel, so as to further improve the display effect of the pixel arrangement structure.

For instance, in some examples, because the blue color sub-pixel generally has a shorter service life, the dimension of the blue color sub-pixel is greater than that of the red color sub-pixel, so as to extend the service life of the blue color sub-pixel.

For instance, in some examples, as illustrated by FIG. 3A and FIG. 3B, the shape of the second color sub-pixel 112 may be a hexagon or a shape formed by a hexagon with a rounded angle at each of vertices of the hexagon, and the shape of the third color sub-pixel 113 may be a hexagon or a shape formed by a hexagon with a rounded angle at each of vertices of the hexagon. In this way, a portion of the second color sub-pixel and the third color sub-pixel close to each other may be one side of a hexagon or one side of a shape formed by a hexagon with a rounded angle at each of vertices of the hexagon, so as to increase areas of the second color sub-pixel and the third color sub-pixel under a certain process accuracy. Of course, the embodiments of the present disclosure include such case but are not limited thereto, and the shape of the second color sub-pixel may be an elongated strip, an ellipse or the like, and the shape of the third color sub-pixel may be an elongated strip, an ellipse or the like.

For instance, in some examples, as illustrated by FIG. 3A and FIG. 3B, the shape of the second color sub-pixel 112 may include a first symmetry axis and a second symmetry axis, and a length of the second color sub-pixel 112 in a direction of the first symmetry axis is greater than a length of the second color sub-pixel 112 in a direction of the second symmetry axis; that is to say, the first symmetry axis is a long axis and the second symmetry axis is a short axis; the first symmetry axis is perpendicular to the first connecting line 121, and the second symmetry axis is perpendicular to the first symmetry axis and is located in a same straight line with the first connecting line 121.

For instance, in some examples, as illustrated by FIG. 3A and FIG. 3B, the shape of the third color sub-pixel 113 may include a third symmetry axis and a fourth symmetry axis, and a length of the third color sub-pixel 113 in a direction of the third symmetry axis is greater than a length of the third color sub-pixel 113 in a direction of the fourth symmetry axis; that is to say, the third symmetry axis is a long axis and the fourth symmetry axis is a short axis; the third symmetry axis is perpendicular to the second connecting line 122, and the fourth symmetry axis is perpendicular to the third symmetry axis and is located in a same straight line with the second connecting line 122.

It should be explained that, in designing the pixel arrangement structure, the sub-pixel (e.g., the first color sub-pixel, the second color sub-pixel or the third color sub-pixel) is usually designed to have a regular shape, for example, rectangle, hexagon or other shapes. In designing, the above-mentioned symmetry axis of the sub-pixel may be a symmetry axis of the regular shape described above. However, in an actual manufacturing process, the shape of the sub-pixel as formed may have an irregular shape, then the symmetry axis of the sub-pixel may not need to be strictly symmetrical, as long as areas at both sides of the symmetry axis have an overlapped area which is more than 80% of each of the two areas at both sides of the symmetry axis. For instance, in some examples, as illustrated by FIG. 3A and FIG. 3B, an edge of the second color sub-pixel 112 close to the third color sub-pixel 113 is substantially parallel to an edge of the third color sub-pixel 113 close to the second color sub-pixel 112; an edge of the second color sub-pixel 112 close to the first color sub-pixel 111 is substantially parallel to an edge of the first color sub-pixel 111 close to the second color sub-pixel 112; and an edge of the third color sub-pixel 113 close to the first color sub-pixel 111 is substantially parallel to an edge of the first color sub-pixel 111 close to the third color sub-pixel 113. In this way, under a certain process accuracy, it can further improve the area of the second color sub-pixel and the area of the third color sub-pixel, so as to further increase the space utilization of the pixel arrangement structure.

It should be explained that, in designing the pixel arrangement structure, the sub-pixel (e.g., the first color sub-pixel, the second color sub-pixel or the third color sub-pixel) is usually designed to have a regular shape, for example, rectangle, hexagon or other shapes. In designing, the above-mentioned "substantially parallel" refers to "strictly parallel". However, in an actual manufacturing process, the shape of the sub-pixel as formed may have an irregular shape, then the above-mentioned "substantially parallel" may not refer to "strictly parallel", but "approximately parallel" is feasible.

For instance, in some examples, as illustrated by FIG. 3A and FIG. 3B, the shape of the first color sub-pixel 111 may be a square. Of course, the embodiments of the present disclosure include such case but are not limited thereto, and the shape of the first color sub-pixel may be a shape formed by a square with a rounded angle at each of vertices of the square.

For instance, in some examples, as illustrated by FIG. 3A and FIG. 3B, a shortest distance between any two of the first color sub-pixel 111, the second color sub-pixel 112 and the third color sub-pixel 113 is the same. That is to say, the shortest distance between the first color sub-pixel 111 and the second color sub-pixel 112, the shortest distance between the first color sub-pixel 111 and the third color sub-pixel 113, and the shortest distance between the second color sub-pixel 112 and the third color sub-pixel 113 are the same, so as to make the most of the process accuracy.

For instance, in some examples, as illustrated by FIG. 3A and FIG. 3B, a distance between the edge of the second color sub-pixel 112 close to the third color sub-pixel 113 and the edge of the third color sub-pixel 113 close to the second color sub-pixel 112 is a first distance; a distance between the edge of the second color sub-pixel 112 close to the first color sub-pixel 111 and the edge of the first color sub-pixel 111 close to the second color sub-pixel 112 is a second distance; a distance between the edge of the third color sub-pixel 113 close to the first color sub-pixel 111 and the edge of the first color sub-pixel 111 close to the third color sub-pixel 113 is a third distance; and the first distance, the second distance and the third distance are substantially the same. It should be explained that, each of the above-described first distance, second distance and third distance may be a shortest distance, or may be a distance between intersections of sides of two sub-pixels intersecting with a connecting line of centers of the two sub-pixels.

For instance, in some examples, as illustrated by FIG. 3A and FIG. 3B, a shape of the second color sub-pixel 112 is the same as a shape of the third color sub-pixel 113; the shape of the second color sub-pixel 112 and the shape of the third color sub-pixel 113 are symmetrical about a diagonal line of a shape of the first color sub-pixel 111 located in a bisector of a right angle formed by the first connecting line 121 and the second connecting line 122. In this way, it can further improve the symmetry and the uniformity of the pixel arrangement structure, thereby further improving the display quality.

For instance, in some examples, as illustrated by FIG. 3A and FIG. 3B, the shape of the first color sub-pixel 111 is a rectangle including a first edge 111A and a second edge 111B adjacent to the first edge 111A; the shape of the second color sub-pixel 112 and the shape of the third color sub-pixel 113 are both hexagons; each of the second color sub-pixel 112 and the third color sub-pixel 113 includes three pairs of parallel opposite edges, one of the three pairs of parallel opposite edges of the second color sub-pixel 112 is substantially parallel to the first edge 111A, and one of the three pairs of parallel opposite edges of the third color sub-pixel 113 is parallel to the second edge 111B. For instance, in some examples, as illustrated by FIG. 3A and FIG. 3B, the minimum repetitive units 110 are arranged along the row direction and the column direction in an array. In two minimum repetitive units 110 that are adjacent in the first direction, a third connecting line 123 of a center of the second color sub-pixel 112 of the minimum repetitive unit 110 located at the leftmost side and a center of the first color sub-pixel 111 of the minimum repetitive unit 110 located at the rightmost side may be located in a same line with the first connecting line 121; furthermore, a length L3 of the third connecting line 123 may be the same as the length L1 of the first connecting line 121, so as to improve the uniformity of the pixel arrangement structure in the first direction.

For instance, in some examples, as illustrated by FIG. 3A and FIG. 3B, in two minimum repetitive units 110 that are adjacent in the second direction, a fourth connecting line 124 of a center of the third color sub-pixel 113 of the minimum repetitive unit 110 located at the lowermost side and a center of the first color sub-pixel 111 of the minimum repetitive unit 110 located at the uppermost side may be located in a same line with the second connecting line 122; furthermore, a length L4 of the fourth connecting line 124 may be the same as the length L2 of the second connecting line 122, so as to improve the uniformity of the pixel arrangement structure in the second direction.

Figure 4:
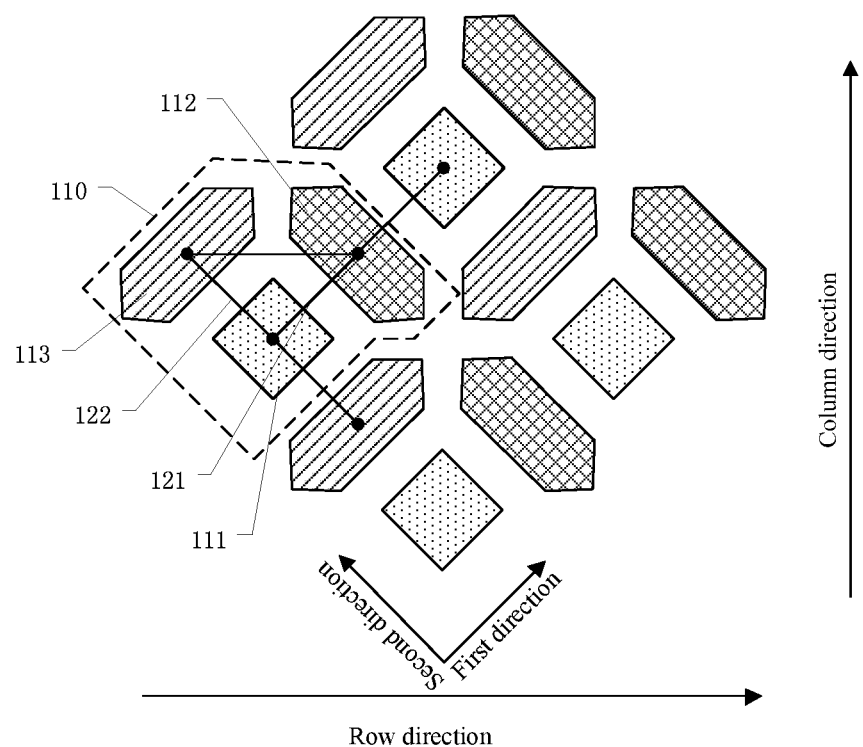
FIG. 4 is a schematic diagram of another pixel arrangement structure provided by an embodiment of the present disclosure.

FIG. 4 is a schematic diagram of another pixel arrangement structure provided by an embodiment of the present disclosure. As illustrated by FIG. 4, an included angle between the first direction and the row direction is 45°, and an included angle between the second direction and the column direction is 45°. In this way, it can prevent from an occurrence of color edge at an edge of a displayed image (e.g., a blue edge or a red edge occurred along the row direction or the column direction), which facilitates improving the display quality. Moreover, because human eyes are more sensitive to image quality in the horizontal or vertical direction but are not that sensitive to image quality in a direction having an included angle of 45° with respect the horizontal direction, the entire display quality can be improved. It should be explained that, when the pixel arrangement structure provided by the present embodiment is applied in a display device, driving signals for respective pixels may be obtained by an algorithm such as interpolation according to a correspondence between the pixel and the pixel position specified by matrix addressed display.

Figure 5:
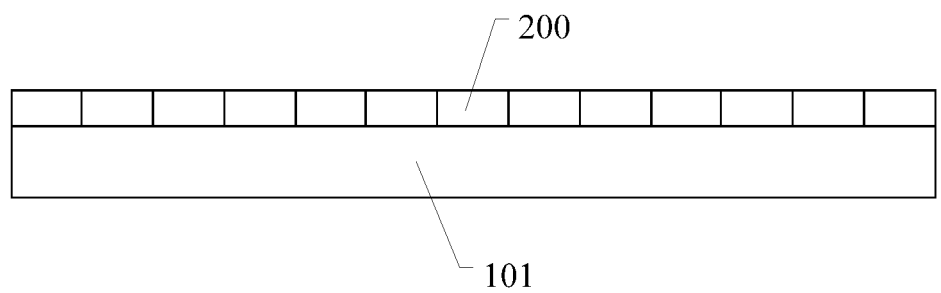
FIG. 5 is a schematic diagram of a display substrate provided by an embodiment of the present disclosure.

An embodiment of the present disclosure further provides a display substrate. FIG. 5 is a schematic diagram of a display substrate provided by an embodiment of the present disclosure. The display substrate includes the pixel arrangement structure described in any of the embodiments or examples above. In this way, the display substrate can increase the resolution of the display device employing the display substrate, and hence provide a display device having veritably high resolution. Moreover, because the pixel arrangement structure has better symmetry, the display effect of the display device employing the display substrate can be improved.

For example, as illustrated by FIG. 5, the display substrate includes a base substrate 101 and a plurality of pixels 200 arranged on the display substrate; the plurality of pixels 200 may adopt the pixel arrangement structure provided by the foregoing embodiments. The pixel 200 may be the minimum repetitive unit 110 in the embodiments above.

For example, as illustrated by FIG. 5, one pixel 200 includes one minimum repetitive unit 110.

Figure 6:
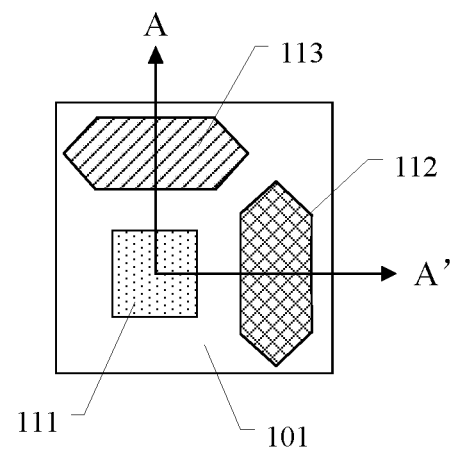
FIG. 6 is a schematic diagram of a display substrate provided by an embodiment of the present disclosure.
Figure 7:
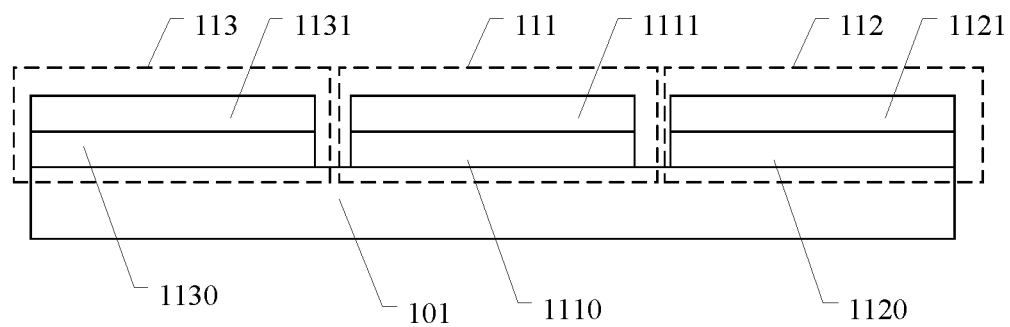
FIG. 7 is a cross-sectional view of a display substrate provided by an embodiment of the present disclosure taken along A-A' direction of FIG. 6.

FIG. 6 is a schematic diagram of another display substrate provided by an embodiment of the present disclosure; and FIG. 7 is a cross-sectional view of a display substrate provided by an embodiment of the present disclosure taken along A-A' direction of FIG. 6. As illustrated by FIG. 7, the first color sub-pixel 111 includes a first color pixel electrode 1110 and a first color light-emitting layer 1111 disposed on the first color pixel electrode 1110; the second color sub-pixel 112 includes a second color pixel electrode 1120 and a second color light-emitting layer 1121 disposed on the second color pixel electrode 1120; the third color sub-pixel 113 includes a third color pixel electrode 1130 and a third color light-emitting layer 1131 disposed on the third color pixel electrode 1130. In this way, the display substrate may be an array substrate.

For instance, in some examples, the first color pixel electrode 1110 is configured to drive the first color light-emitting layer 1111 to emit light.

For example, a shape of the first color pixel electrode 1110 may be the same as a shape of the first color sub-pixel 111. Of course, the embodiments of the present disclosure include such case but are not limited thereto. The shape of the first color pixel electrode 1110 may be different from that of the first color sub-pixel 111, and the shape of the first color sub-pixel 111 may be defined by a pixel defining layer.

It should be explained that, the above-described shape of the first color sub-pixel is a shape of a light-emitting region of the first color sub-pixel. Moreover, the specific shape of the first color light-emitting layer may be configured according to the manufacturing process, without limiting the embodiments of the present disclosure. For example, the shape of the first color light-emitting layer may be determined by a shape of an opening provided in a mask of the manufacturing process.

For example, the first color pixel electrode 1110 and the first color light-emitting layer 1111 may be in contact with each other so as to drive the light-emitting layer to emit light at the contact portion. The contact portion between the first color pixel electrode 1110 and the first color light-emitting layer 1111 is an active portion of the sub-pixel which is capable of emitting light. Therefore, the shape of the first color sub-pixel as mentioned above is the shape of the light-emitting region of the first color sub-pixel. In the embodiments of the present disclosure, the first color pixel electrode 1110 may be an anode, but is not limited to an anode; a cathode of a light-emitting diode may also be used as the pixel electrode.

For instance, in some examples, the second color pixel electrode 1120 may be configured to drive the second color light-emitting layer 1121 to emit light.

For example, a shape of the second color pixel electrode 1120 may be the same as a shape of the second color sub-pixel 112. Of course, the embodiments of the present disclosure include such case but are not limited thereto. The shape of the second color pixel electrode 1120 may be different from that of the second color sub-pixel 112, and the shape of the second color sub-pixel 112 may be defined by a pixel defining layer.

It should be explained that, the above-described shape of the second color sub-pixel is a shape of a light-emitting region of the second color sub-pixel. Moreover, the specific shape of the second color light-emitting layer may be configured according to the manufacturing process, without limiting the embodiments of the present disclosure. For example, the shape of the second color light-emitting layer may be determined by a shape of an opening provided in a mask of the manufacturing process.

For example, the second color pixel electrode 1120 and the second color light-emitting layer 1121 may be in contact with each other so as to drive the light-emitting layer to emit light at the contact portion. The contact portion between the second color pixel electrode 1120 and the second color light-emitting layer 1121 is an active portion of the sub-pixel which is capable of emitting light. Therefore, the shape of the second color sub-pixel as mentioned above is the shape of the light-emitting region of the second color sub-pixel. In the embodiments of the present disclosure, the second color pixel electrode 1120 may be an anode, but is not limited to an anode; a cathode of a light-emitting diode may also be used as the pixel electrode.

For instance, in some examples, the third color pixel electrode 1130 is configured to drive the third color light-emitting layer 1131 to emit light.

For example, a shape of the third color pixel electrode 1130 may be the same as a shape of the third color sub-pixel 113. Of course, the embodiments of the present disclosure include such case but are not limited thereto. The shape of the third color pixel electrode 1130 may be different from that of the third color sub-pixel 113, and the shape of the third color sub-pixel 113 may be defined by a pixel defining layer.

It should be explained that, the above-described shape of the third color sub-pixel is a shape of a light-emitting region of the third color sub-pixel. Moreover, the specific shape of the third color light-emitting layer may be configured according to the manufacturing process, without limiting the embodiments of the present disclosure. For example, the shape of the third color light-emitting layer may be determined by a shape of an opening provided in a mask of the manufacturing process. For example, the third color pixel electrode 1130 and the third color light-emitting layer 1131 may be in contact with each other so as to drive the light-emitting layer to emit light at the contact portion. The contact portion between the third color pixel electrode 1130 and the third color light-emitting layer 1131 is an active portion of the sub-pixel which is capable of emitting light. Therefore, the shape of the third color sub-pixel as mentioned above is the shape of the light-emitting region of the third color sub-pixel. In the embodiments of the present disclosure, the third color pixel electrode 1130 may be an anode, but is not limited to an anode; a cathode of a light-emitting diode may also be used as the pixel electrode.

It should be explained that, for each of the sub-pixels, the area of the pixel electrode may be slightly greater than the area of the light-emitting layer, or, the area of the light-emitting layer may be slightly greater than the area of the pixel electrode, without particularly limited in the embodiments of the present disclosure. For example, the light-emitting layer herein may include an electroluminescent layer per se and other functional layers located at both sides of the electroluminescent layer, for example, a hole injection layer, a hole transportation layer, an electron injection layer, an electron transportation layer and the like. In some embodiments, the shape of the sub-pixel may also be defined by the pixel defining layer. For example, a lower electrode (e.g., anode) of the light-emitting diode may be disposed below the pixel defining layer, the pixel defining layer includes an opening for defining a sub-pixel, and the opening exposes a portion of the lower electrode; when the light-emitting layer is formed in the opening of the pixel defining layer, the light-emitting layer is in contact with the lower electrode so as to drive the light-emitting layer to emit light at this contact portion. Therefore, under such circumstance, the opening of the pixel defining layer defines the shape of the sub-pixel.

The shapes for various sub-pixels described in the embodiments of the present disclosure are all rough shapes. When forming light-emitting layers or various electrode layers, it may not be guaranteed that the edge of the sub-pixel is strictly a straight line and the corner has strictly an angle shape. For example, the light-emitting layer may be formed by an evaporation process using a mask; as a result, the corner part may have a shape of rounded angle. Under some circumstances, etching a metal may result in a draft angle; therefore, when forming the light-emitting layer of the sub-pixel by using the evaporation process, one corner of the light-emitting layer may be removed.

Figure 8:
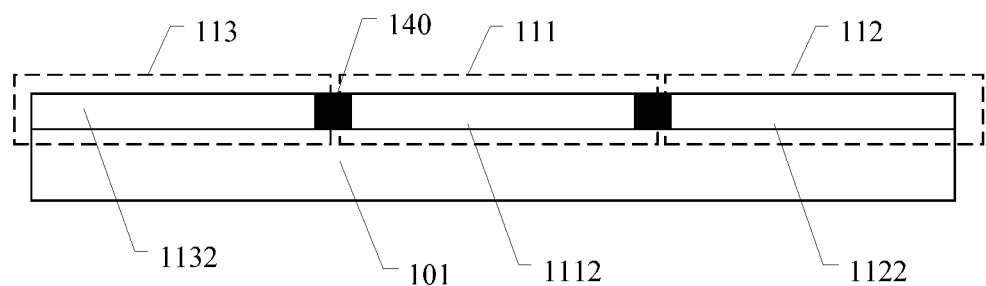
FIG. 8 is a cross-sectional view of another display substrate provided by an embodiment of the present disclosure taken along A-A' direction of FIG. 6.

FIG. 8 is a cross-sectional view of another display substrate provided by an embodiment of the present disclosure taken along A-A' direction of FIG. 6. As illustrated by FIG. 8, the first color sub-pixel 111 includes a first color filter 1112, the second color sub-pixel 112 includes a second color filter 1122, and the third color sub-pixel 113 includes a third color filter 1132. Therefore, the display substrate may be a color filter substrate. It should be explained that, when the display substrate is a color filter substrate, it can be applied not only in a liquid crystal display panel but also in a display panel utilizing white light OLED combined with a color filter mode.

For instance, in some example, as illustrated by FIG. 8, the display substrate further includes a black matrix 140 disposed between the first color filter 1112, the second color filter 1122 and the third color filter 1132.

An embodiment of the present disclosure further provides a display device. The display device includes any display device provided by the foregoing embodiments. Therefore, it can increase the resolution of the display device, thereby providing a display device having veritably high resolution. Moreover, because the pixel arrangement structure has better symmetry, the display effect of the display device can be improved.

For instance, in some example, the display device may be any product or component having a display function, such as a mobile phone, a tablet computer, a television, a displayer, a notebook computer, a digital photo frame and a navigation device.

An embodiment of the present disclosure further provides a mask assembly set. The mask assembly set is configured to form the pixel arrangement structure provided by any of the embodiments or examples above. The mask assembly set may include a first mask configured to form the first color sub-pixel, a second mask configured to form the second color sub-pixel and a third mask configured to form the third color sub-pixel.

Figure 9A:
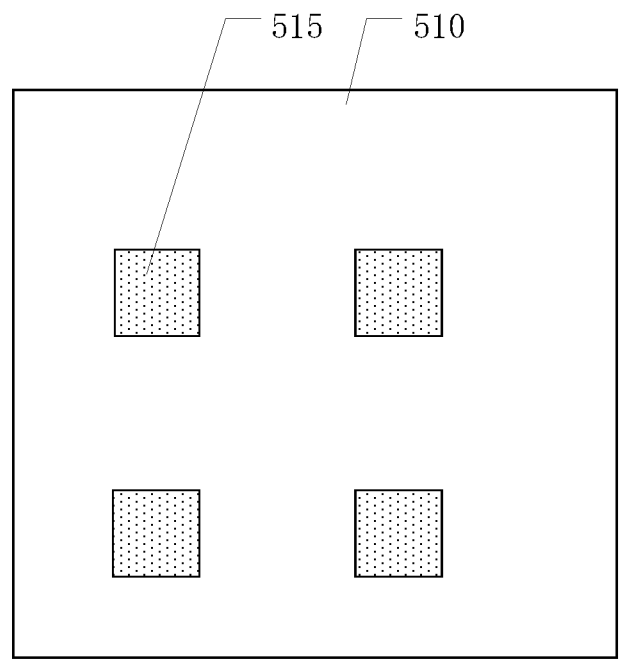
FIG. 9A is a schematic diagram of a first mask provided by an embodiment of the present disclosure.
Figure 9B:
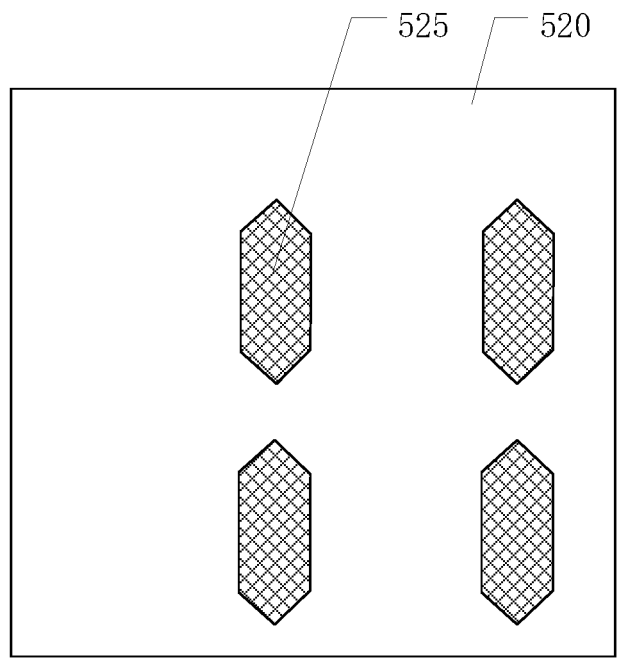
FIG. 9B is a schematic diagram of a second mask provided by an embodiment of the present disclosure.
Figure 9C:
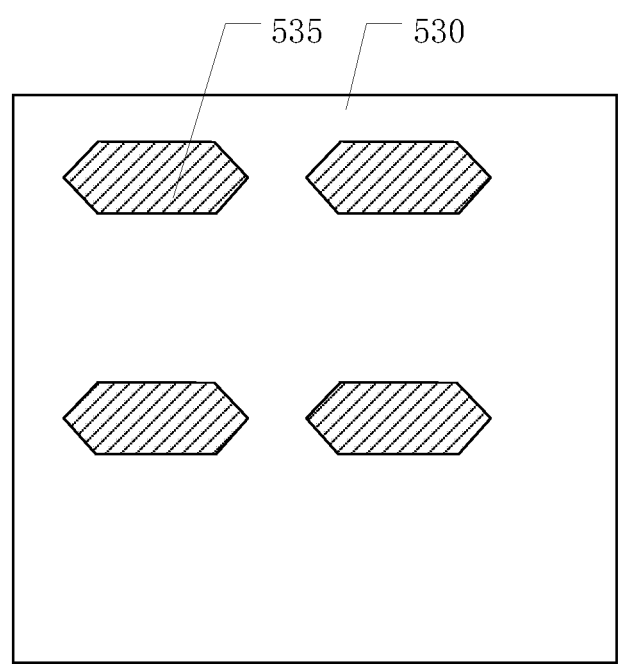
FIG. 9C is a schematic diagram of a third mask provided by an embodiment of the present disclosure.

FIG. 9A is a schematic diagram of a first mask provided by an embodiment of the present disclosure; FIG. 9B is a schematic diagram of a second mask provided by an embodiment of the present disclosure; and FIG. 9C is a schematic diagram of a third mask provided by an embodiment of the present disclosure. As illustrated by FIGS. 9A-9C, the mask assembly set includes a first mask 510 including a first opening 515, configured to form the first color sub-pixel; a second mask 520 including a second opening 525, configured to form the second color sub-pixel; and a third mask 530 including a third opening 535, configured to form the third color sub-pixel. For example, the first mask may be provided with a first opening so as to form the light-emitting layer of the first color sub-pixel in an evaporation process; the second mask may be provided with a second opening so as to form the light-emitting layer of the second color sub-pixel in an evaporation process; and the third mask may be provided with a third opening so as to form the light-emitting layer of the third color sub-pixel in an evaporation process.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

The foregoing is only specific embodiments of the present disclosure, but the protection scope of the present disclosure is not limited thereto. Any modifications or alternations easily envisaged by one person skilled in the art within the technical scope of the present disclosure should fall within the protection scope of the present disclosure. Therefore, the protection scope of the present disclosure should be based on protection scope of the claims.

What is claimed is:

1. A pixel arrangement structure, comprising:
a plurality of minimum repetitive units arranged along a row direction and a column direction in an array,
wherein each of the plurality of minimum repetitive units comprises a first color sub-pixel, a second color sub-pixel and a third color sub-pixel,
a first connecting line of a center of the first color sub-pixel and a center of the second color sub-pixel extends along a first direction,
a second connecting line of the center of the first color sub-pixel and a center of the third color sub-pixel extends along a second direction,
an orthographic projection of the first color sub-pixel on a first straight line extending along the first direction falls within an orthographic projection of the third color sub-pixel on the first straight line, and
an orthographic projection of the first color sub-pixel on a second straight line extending along the second direction falls within an orthographic projection of the second color sub-pixel on the second straight line,
the shape of the second color sub-pixel is a complete and continuous pattern, which has a first symmetry axis and a second symmetry axis, a length of the second color sub-pixel in a direction of the first symmetry axis is greater than a length of the second color sub-pixel in a direction of the second symmetry axis, the first symmetry axis is perpendicular to the first connecting line, and the second symmetry axis is perpendicular to the first symmetry axis and is located in a same straight line with the first connecting line,
the shape of the third color sub-pixel is a complete and continuous pattern, which has a third symmetry axis and a fourth symmetry axis, a length of the third color sub-pixel in a direction of the third symmetry axis is greater than a length of the third color sub-pixel in a direction of the fourth symmetry axis, the third symmetry axis is perpendicular to the second connecting line, and the fourth symmetry axis is perpendicular to the third symmetry axis and is located in a same straight line with the second connecting line,
the shape of the first color sub-pixel is a complete square shape, which comprises a fifth symmetry axis perpendicular to the first connecting line, and a sixth symmetry axis perpendicular to the second connecting line,
a part of an orthographic projection of the third color sub-pixel on the first connecting line is located in the second color sub-pixel,
a part of an orthographic projection of the second color sub-pixel on the second connecting line is located in the third color sub-pixel.

2. The pixel arrangement structure according to claim 1, wherein a portion of the second color sub-pixel that extends beyond the first color sub-pixel in the second direction is adjacent to a portion of the third color sub-pixel that extends beyond the first color sub-pixel in the first direction.

3. The pixel arrangement structure according to claim 1, wherein an included angle between the first direction and the second direction is in the range from 80° to 100°.

4. The pixel arrangement structure according to claim 1, wherein each of the plurality of minimum repetitive units is one pixel, and line segments connecting the center of the first color sub-pixel, the center of the second color sub-pixel and the center of the third color sub-pixel constitute a triangle.

5. The pixel arrangement structure according to claim 4, wherein the triangle comprises a right triangle or an isosceles right triangle.

6. The pixel arrangement structure according to claim 1, wherein the first direction is parallel to the row direction, and the second direction is parallel to the column direction.

7. The pixel arrangement structure according to claim 1, wherein an included angle between the first direction and the row direction is 45°, and an included angle between the second direction and the column direction is 45°.

8. The pixel arrangement structure according to claim 1, wherein a shape of the second color sub-pixel is at least one selected from the group consisting of an ellipse, a hexagon, and a shape formed by a hexagon with a rounded corner at each of vertices of the hexagon, and a shape of the third color sub-pixel is at least one selected from the group consisting of an ellipse, a hexagon, and a shape formed by a hexagon with a rounded corner at each of vertices of the hexagon.

9. The pixel arrangement structure according to claim 8, wherein an edge of the second color sub-pixel close to the third color sub-pixel is substantially parallel to an edge of the third color sub-pixel close to the second color sub-pixel,
an edge of the second color sub-pixel close to the first color sub-pixel is substantially parallel to an edge of the first color sub-pixel close to the second color sub-pixel, and
an edge of the third color sub-pixel close to the first color sub-pixel is substantially parallel to an edge of the first color sub-pixel close to the third color sub-pixel.

10. The pixel arrangement structure according to claim 9, wherein a distance between the edge of the second color sub-pixel close to the third color sub-pixel and the edge of the third color sub-pixel close to the second color sub-pixel is a first distance,
- a distance between the edge of the second color sub-pixel close to the first color sub-pixel and the edge of the first color sub-pixel close to the second color sub-pixel is a second distance,
- a distance between the edge of the third color sub-pixel close to the first color sub-pixel and the edge of the first color sub-pixel close to the third color sub-pixel is a third distance, and
- the first distance, the second distance and the third distance are substantially the same.

11. The pixel arrangement structure according to claim 1, wherein a shape of the second color sub-pixel is the same as a shape of the third color sub-pixel,
- the shape of the second color sub-pixel and the shape of the third color sub-pixel are symmetrical about a diagonal line of a shape of the first color sub-pixel located in a bisector of a right angle formed by the first connecting line and the second connecting line.

12. The pixel arrangement structure according to claim 11, wherein the shape of the first color sub-pixel comprises a first edge and a second edge adjacent to the first edge,
- the shape of the second color sub-pixel and the shape of the third color sub-pixel are both hexagons, and
- each of the second color sub-pixel and the third color sub-pixel comprises three pairs of parallel opposite edges, one of the three pairs of parallel opposite edges of the second color sub-pixel is parallel to the first edge, and one of the three pairs of the third color sub-pixel is parallel to the second edge.

13. The pixel arrangement structure according to claim 1, wherein a first virtual line being perpendicular to the first connecting line and passing through an endpoint of the third color sub-pixel that is close to the second color sub-pixel passes through the second color sub-pixel,
- a second virtual line being perpendicular to the second connecting line and passing through an endpoint of the second color sub-pixel that is close to the third color sub-pixel passes through the third color sub-pixel.

14. A display substrate, comprising:
the pixel arrangement structure according to claim 1.

15. The display substrate according to claim 14, further comprising:
- a base substrate; and
- a plurality of pixels on the base substrate,
- wherein one of the plurality of pixels comprises one of the plurality of minimum repetitive units.

16. The display substrate according to claim 15, wherein the first color sub-pixel comprises a first color pixel electrode and a first color light-emitting layer disposed on the first color pixel electrode, the second color sub-pixel comprises a second color pixel electrode and a second color light-emitting layer disposed on the second color pixel electrode, the third color sub-pixel comprises a third color pixel electrode and a third color light-emitting layer disposed on the third color pixel electrode,
- the first color pixel electrode is configured to drive the first color light-emitting layer to emit light,
- the second color pixel electrode is configured to drive the second color light-emitting layer to emit light, and
- the third color pixel electrode is configured to drive the third color light-emitting layer to emit light.

17. The display substrate according to claim 15, wherein the first color sub-pixel comprises a first color filter, the second color sub-pixel comprises a second color filter, and the third color sub-pixel comprises a third color filter.

18. A display device, comprising the display substrate according to claim 14.

19. A mask assembly set configured to manufacture the display substrate according to claim 14, comprising:
- a first mask comprising a first opening, configured to form the first color sub-pixel;
- a second mask comprising a second opening, configured to form the second color sub-pixel; and
- a third mask comprising a third opening, configured to form the third color sub-pixel.

\* \* \* \* \*